(12) United States Patent
Hoffman

(10) Patent No.: US 6,252,462 B1
(45) Date of Patent: Jun. 26, 2001

(54) CAPACITOR TRANSIMPEDANCE AMPLIFIER (CTIA) WITH SHARED LOAD

(75) Inventor: Alan W. Hoffman, Goleta, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/343,288

(22) Filed: Jun. 30, 1999

(51) Int. Cl.[7] ............................. H03F 3/08; H01J 40/14
(52) U.S. Cl. ................................. 330/308; 250/214 A
(58) Field of Search .................................... 330/308, 110; 250/214 A; 348/300

(56) References Cited

U.S. PATENT DOCUMENTS

| | | | |
|---|---|---|---|
| Re. 34,908 | 4/1995 | Wyles et al. ............... | 250/208.1 |
| 4,365,209 | * 12/1982 | Yamauchi ..................... | 330/308 |
| 4,786,831 | 11/1988 | Morse et al. ................. | 307/490 |
| 4,857,725 | * 8/1989 | Goodnough et al. ......... | 250/214 A |
| 4,956,716 | 9/1990 | Hewitt et al. ................ | 358/212 |
| 4,978,872 | * 12/1990 | Morse et al. ................ | 250/338.1 |
| 5,043,820 | 8/1991 | Wyles et al. ................. | 358/213.28 |
| 5,233,180 | * 8/1993 | Tsuruta et al. ................ | 250/214 A |
| 5,322,994 | * 6/1994 | Uno ............................. | 250/214 A |
| 5,602,511 | 2/1997 | Woolaway .................... | 330/282 |
| 5,773,815 | * 6/1998 | Stevens ........................ | 250/214 A |

\* cited by examiner

Primary Examiner—Robert Pascal
Assistant Examiner—Khanh Van Nguyen
(74) Attorney, Agent, or Firm—William C. Schubert; Glenn H. Lenzen, Jr.

(57) ABSTRACT

A readout circuit (1) has an x-row by y-column array of readout unit cells (10) each having an input for coupling to an output of a radiation detector (16) and an output that is switchably coupled to one of y column output lines (21). Each unit cell includes a driver transistor (12) having a gate terminal coupled to the detector, a source terminal coupled to a source voltage, and a drain terminal switchably coupled to a drain voltage through one of y loads, such as one of y current sources (18). The drain terminal is switchably coupled to the one of y current sources through an output multiplexer switch (20). The current source is a common current source for all of the x unit cells coupled to a same one of the y column output lines. The unit cell further includes a capacitance coupled between the gate and drain terminals, and a reset switch also coupled between the gate and drain terminals.

16 Claims, 3 Drawing Sheets

CAPACITOR TRANSIMPEDANCE AMPLIFIER (CTIA) WITH SHARED LOAD

FIELD OF THE INVENTION

This invention relates generally to amplifier circuitry for use with detectors of electromagnetic radiation and, in particular, to capacitive transimpedance amplifiers of a type used in readout integrated circuits (ROICs) that are electrically connected to a focal plane array (FPA) containing solid state detectors of infrared (IR) radiation.

BACKGROUND OF THE INVENTION

The CTIA (Capacitor Transimpedance Amplifier) is utilized in infrared and other sensing applications to integrate the current from a detector for a specified period of time, referred to as the integration time. Referring to FIG. 1, an exemplary CTIA 3 of a particular unit cell contains a high gain inverting amplifier having a driver 2 with a capacitor in the feedback loop ($C_{FB}$). The inverting amplifier typically contains, as a minimum, two active transistors or MOSFETs. A first transistor or MOSFET is used to provide a constant current source (typically referred to as the load 1), while the second transistor or MOSFET is used to implement the driver 2. A reset switch (typically another transistor) is placed across the feedback capacitor and is closed to discharge the capacitor and is then opened to begin the integration time. The output voltage of the CTIA 3 is proportional to the product of the detector current ($I_D$) and the integration time, and is inversely proportional to the value of the feedback capacitor $C_{FB}$. The input voltage is maintained near the reset value by the feedback loop, which maintains a nearly constant bias on the radiation detector. At the end of the integration time the output voltage is sampled by closing an output multiplexer (MUX) switch, the reset switch is then closed, and the CTIA 3 is ready for the next integration.

FIG. 1 shows a conventional case where a two dimensional array of detectors and unit cells are arranged in a row and column (x by y) matrix (only a part of one column is depicted). Typically the MUX switches are closed and then opened one after another to readout in sequence the x unit cell outputs from each of the rows connected to a single one of the y column output lines. Also connected to the column line may be an input of a sample and hold (S/H) circuit (not shown), followed by a voltage follower (not shown). The output voltages may eventually be converted to a digital form and then operated on by a data processing system for performing any desired image processing, or to simply store the image(s) for subsequent transmission to another location. This latter type of operation is typical in space-based and other types of astronomy applications.

One drawback to the use of the conventional CTIA is that it is an active amplifier that requires continuous current. This current is a dominant source of power dissipation in the conventional CTIA, and is also a source of light emission. That is, it is known that, when powered on and operating, silicon-based MOSFET circuits will generate a small amount of IR radiation (typically in the one micron range). Both of these effects of normal operation (i.e., power dissipation and IR light generation) are disadvantageous, especially so when the CTIA is used in a low temperature system with limited cooling capacity, and/or in those systems intended to detect low light levels.

For example, in some astronomy applications, such as deep field galaxy surveys, one may be imaging distant objects over a period of hours or even days, literally on a photon-by-photon basis. As may be appreciated, in such low light level applications it is important to reduce or eliminate any extraneous sources of detectable energy which may deteriorate the signal to noise ratio of the imaging system.

A further drawback to the use of the conventional CTIA is the complexity of the amplifier at each detector element, commonly referred to as the unit cell. That is, since each CTIA 3 of each unit cell has its own associated load 1 (which can be a resistance but is more typically implemented as a transistor (e.g., a MOSFET) connected so as to form the constant current source), the circuit area required to lay out the unit cell is increased, and the overall yield in large arrays is thus also reduced. Reference in this regard can be had to, by example, FIG. 6 of U.S. Pat. No.: 4,978,872, "Integrating Capacitively Coupled Transimpedance Amplifier", by Morse et al., where a MOSFET load 122 is shown.

Further reference with regard to various aspects of CTIAs may be had to the following U.S. Patents, namely U.S. Pat. No.: 4,956,716, "Imaging System Employing Charge Amplifier", by Hewitt et al.; U.S. Pat. No.: 5,043,820, "Focal Plane Array Readout Employing One Capacitive Feedback Transimpedance Amplifier For Each Column", by Wyles et al.; U.S. Pat. No.: 5,602,511, "Capacitive Transimpedance Amplifier Having Dynamic Compression", by Woolaway; and U.S. Pat. No. 4,786,831, entitled "Integrating Capacitively Coupled Transimpedance Amplifier", by Morse et al. The disclosures of these U.S. Patents are incorporated by reference herein in their entireties.

OBJECTS AND ADVANTAGES OF THE INVENTION

It is a first object and advantage of this invention to provide an improved unit cell for use in radiation detection applications.

It is a further object and advantage of this invention to provide a unit cell that exhibits reduced complexity, reduced circuit area, reduced power dissipation, and reduced light emission characteristics as compared to conventional unit cells.

It is an other object and advantage of this invention to provide a common load that is switchably connected into and shared between a plurality of unit cells, each comprising a CTIA.

SUMMARY OF THE INVENTION

The foregoing and other problems are overcome and the objects and advantages are realized by methods and apparatus in accordance with embodiments of this invention, wherein there is provided a CTIA with a multiplexed load (CTIA w/ML). The multiplexed load refers to a load that is shared (at different times) by a plurality of CTIAs, e.g., by a hundred or a thousand or more CTIAs. The driver for each radiation detector element is connected to the load only when an output multiplexer select switch is closed for that detector element. The remaining components of the CTIA circuit, i.e., the driver, the feedback capacitor, and the reset switch, are still present for each amplifier and are not shared. When the output multiplexer select switch for a particular amplifier is closed, current flows from the common load (current source) through the particular amplifier, which then operates as a "normal" CTIA. When the output multiplier switch is open, no current flows in the amplifier circuit, and the radiation detector current integrates instead on the input capacitance, in a manner similar to a self-integrating amplifier, also known as a SFD (Source Follower per Detector).

A readout circuit in accordance with this invention has an x-row by y-column array of readout unit cells each having an input for coupling to an output of a radiation detector and an output that is switchably coupled to one of y column output lines. Each unit cell includes a driver transistor having a gate terminal coupled to the detector, a source terminal coupled to a source voltage, and a drain terminal switchably coupled to a drain voltage through one of y loads, such as one of y current sources. The drain terminal is switchably coupled to the one of y current sources through an output multiplexer switch. The current source is a common current source for all of the x unit cells coupled to a same one of the y column output lines. The unit cell further includes a capacitance coupled between the gate and drain terminals, and a reset switch also coupled between the gate and drain terminals.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
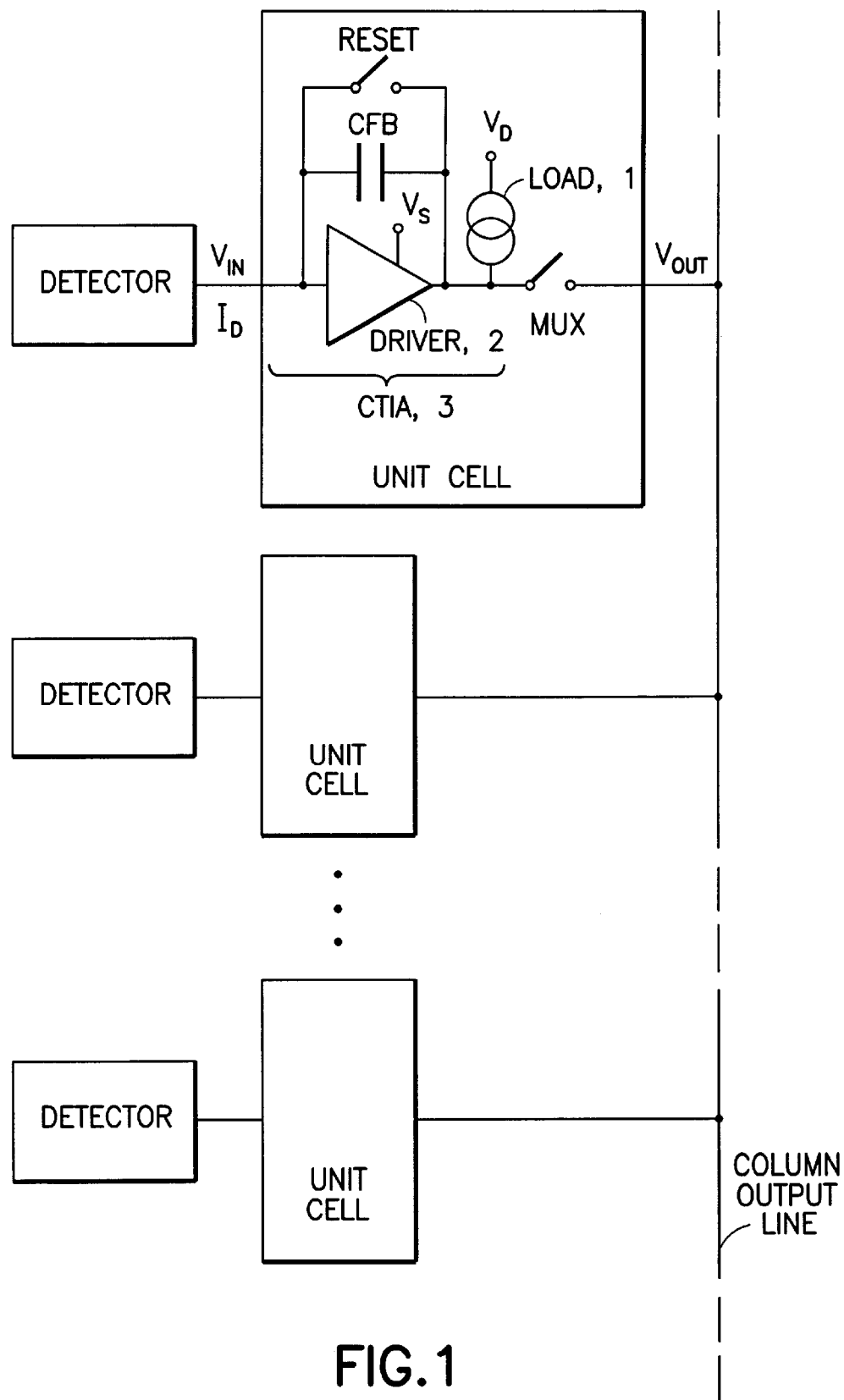
FIG. 1 is simplified block diagram of a portion of a focal plane array, and shows a plurality of conventional readout integrated circuit unit cells each having a CTIA comprised of a driver having an associated load, which are contained within the unit cell.
Figure 2:
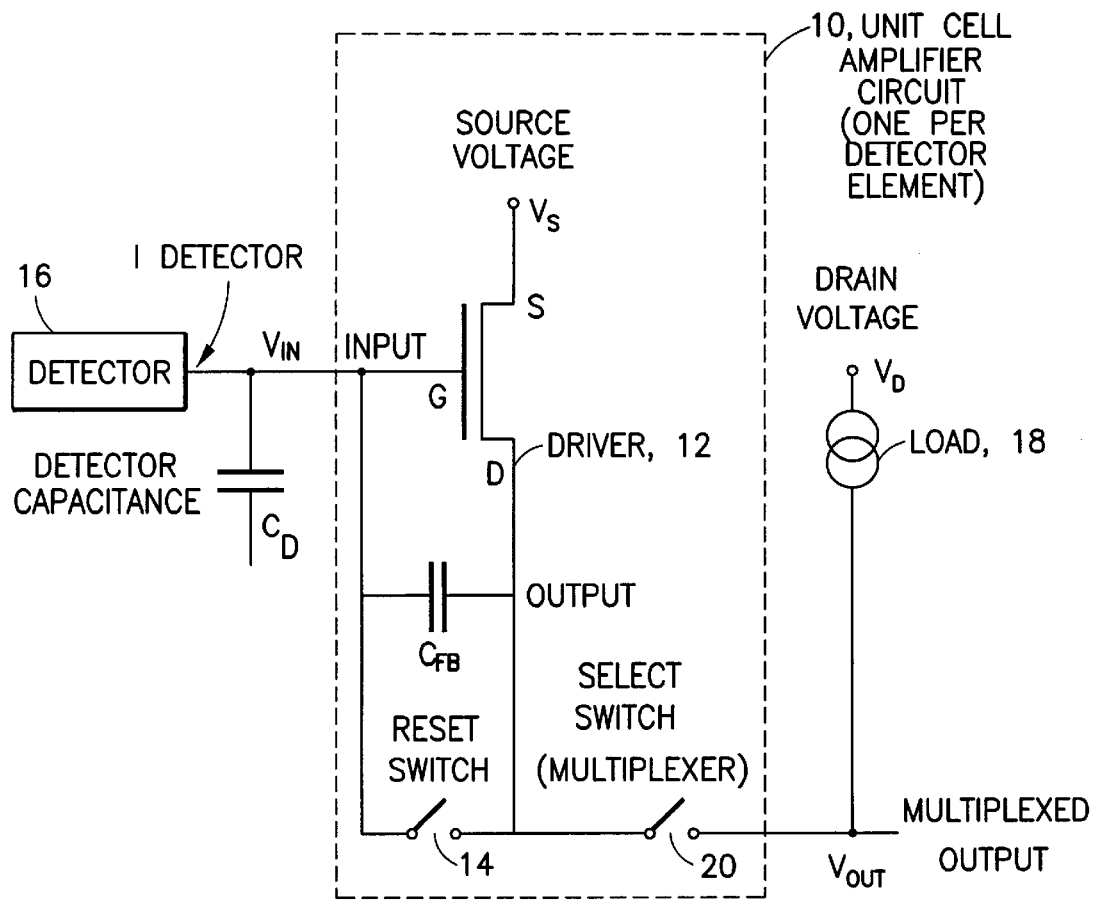
FIG. 2 is a schematic diagram of an improved unit cell having a CTIA in accordance with this invention, wherein the load is located external to the unit cell and is switchably connected to the output node of the driver transistor for being multiplexed or shared by a plurality of unit cells.

Referring to FIG. 2, the components of the CTIA w/ML unit cell 10 are the driver transistor or MOSFET amplifier 12 with a feedback capacitor $C_{FB}$ and a reset switch 14 connected between the input and the output of the amplifier 12. The input of the amplifier 12 is coupled to the output of a radiation detector 16, which has an associated detector capacitance ($C_D$). The MOSFET amplifier transistor 12 has a source (S) node or terminal, a gate (G) node or terminal, and a drain (D) node or terminal, as is conventional. A bipolar transistor implementation (not shown) would instead have collector, base and emitter terminals.

In one exemplary, but not limiting, embodiment the detector 16 is an IR-responsive photovoltaic detector fabricated from a Group III–V or a Group II–VI semiconductor material (e.g., InSb or HgCdTe), and is one element or pixel of an array of elements (e.g., a 1024×1024 array). The unit cell 10 (e.g., one of a corresponding 1024×1024 array of unit cells) is fabricated as a part of a silicon readout integrated circuit (ROIC) that is bonded to (e.g., hybridized with) the detector array using, for example, indium cold weld bumps. The resulting detector array/ROIC hybrid circuit package is then located on and operated at the cold focal plane of an IR imaging system.

In accordance with this invention a load 18 for the unit cell 10 is not located in the unit cell, but is instead located external to the unit cell 10. The load 18 (e.g., a MOSFET that has one terminal connected to a MOSFET operating potential (i.e., drain voltage ($V_D$)) and that forms a constant current source) is then connected to the driver 12 by closing a select (multiplexer) switch 20 within the unit cell 10. When so connected the driver 12 and load 18 constitute an inverting amplifier in a standard CTIA mode of operation, and are referred to herein as a CTIA with multiplexed load, or CTIA w/ML. Keeping the select switch 20 closed, the CTIA w/ML is first reset by closing the reset switch 14. The output voltage ($V_{OUT}$) during the reset period is approximately equal to the value of another MOSFET operating potential (i.e., source voltage ($V_s$)) plus the threshold voltage of the driver 12 MOSFET. At this time, the voltage on the amplifier side of the detector 16 is the same as the output. After opening the reset switch 14, the output voltage $V_{OUT}$ changes by an amount $I_{detector}T/C_{FB}$, where $I_{detector}$ is the current from the detector 16, T is the time since opening the reset switch 14, and $C_{FB}$ is the value of the feedback capacitor. During the reset operation and subsequent sampling of the output voltage, the CTIA w/ML operates in a manner that is identical to a conventional CTIA.

A typical value for the output of the current source of the common load 18 is in the range of about 1 microamp to about 5 microamps, although the current source 18 could output any desired current. Furthermore, in other embodiments of this invention the common load 18 need not be implemented as an active load, but could instead be a passive load such as a resistance or a reactance.

When the select switch 20 for the particular driver 12 is opened (and thus when the load 18 may be connected to another unit cell in the same column), the amplifier operates in a manner analogous to a self-integrator, source-follower-per-detector (SFD). More particularly, when the select switch 20 is open, no current flows in the driver/load amplifier circuit. The detector bias voltage, which was maintained near the reset voltage when the CTIA feedback circuit was active (select switch closed) is now allowed to change as the detector current discharges the intrinsic detector capacitance ($C_D$). So long as the detector capacitance is not allowed to fully discharge, the detector signal is faithfully integrated on $C_D$. Reference with regard to a SFD circuit arrangement can be had to Re. 34,908, Apr. 18, 1995, entitled "3-Transistor Source Follower-Per-Detector Unit Cell for 2-Dimensional Focal Plane Arrays", by Wyles et al., the disclosure of which is incorporated by reference herein in its entirety.

At the end of integration time (which for an exemplary astronomy application could be 100 seconds or more), the select switch 20 is again closed and current flows through the driver 12 and the load 18, and the circuit again operates as a standard CTIA to read out the detector signal at the end of the integration time. The detector bias voltage is forced back to the voltage applied immediately after reset by the action of the feedback capacitor $C_{FB}$.

Figure 3:
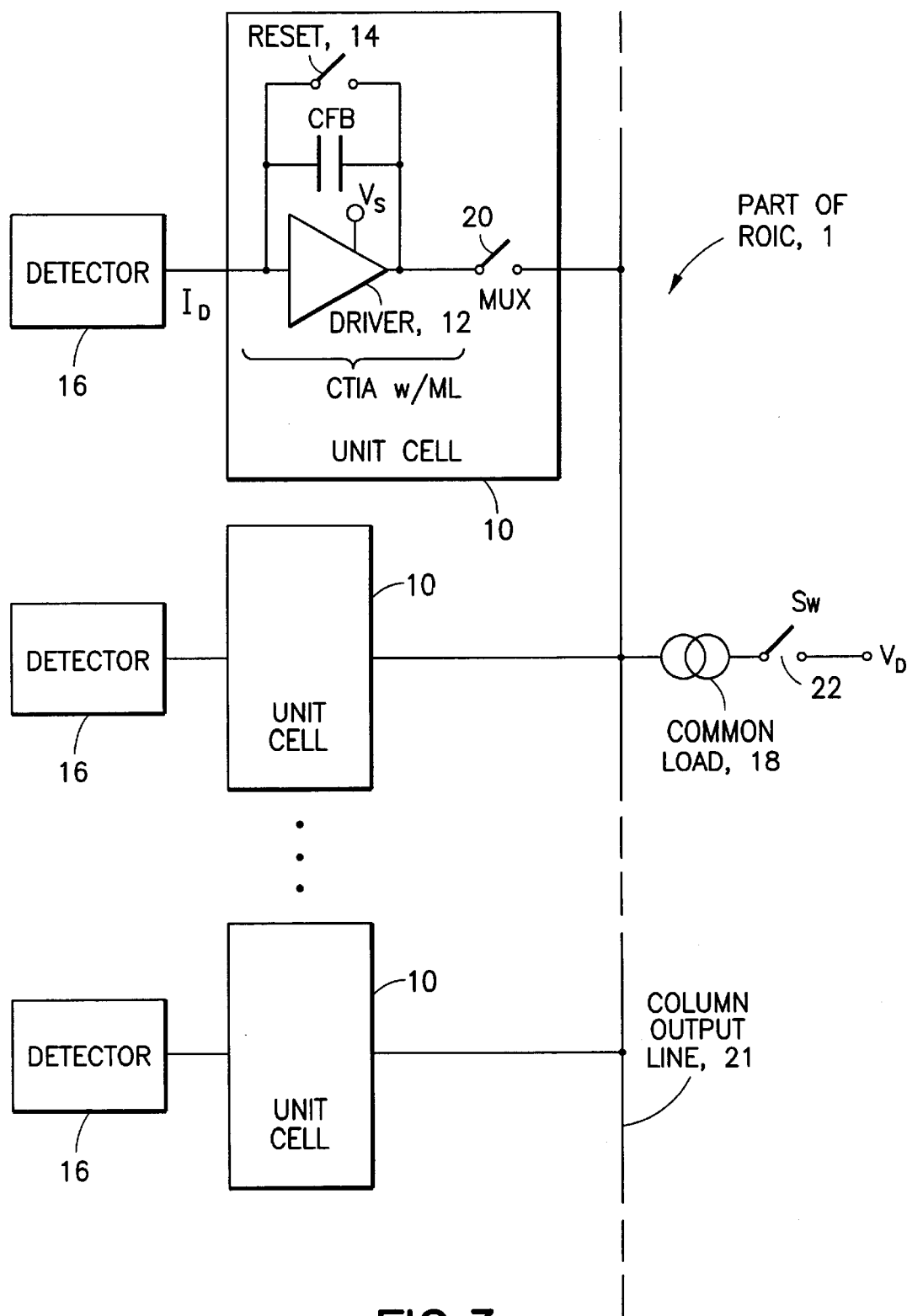
FIG. 3 is simplified block diagram of a portion of a readout integrated circuit of a focal plane array, and shows a plurality of readout integrated circuit unit cells each having a CTIA and the external common load in accordance with the teachings of this invention.

Referring to FIG. 3, it can be seen that in the illustrated portion of the ROIC 1 the common load 18 is coupled to a column output line 21, and can then be conductively coupled to a given one of the drivers 12, depending on which of the output multiplexer switches 20 happens to be closed.

Further in accordance with this invention the common load 18 could itself be switchably coupled to $V_D$ through a switch (SW) 22. In accordance with this embodiment the common load 18 is first connected to $V_D$ by SW 22, then the individual MUX switches 20 are closed in sequence to readout all of the unit cells 10 in a row-by-row fashion, and then the SW 22 is opened to remove power from the common load 22, thereby conserving even more power. The SW 22 could as well be located between the common load 18 and the column output line 21, or the SW 22 could be eliminated altogether. For a case where there is an x row by y column array of unit cells, there would be y common loads 22 (i.e, one per column), and each could be switched on (and off) in tandem using the SW 22. In this regard it is understood that the various switches shown in the Figures are typically implemented by FETs, and that various timing pulses are used to turn the FETs on and off (i.e., open and close the switches). These timing pulses have not been shown so as to not overly-complicate the depiction and description of the invention.

Generally, for a multiplexed array of detectors, the CTIA w/ML operates in the SFD mode most of the time, and operates in the CTIA mode only for the relatively short time that its output voltage is being sampled. The circuit therefore operates differently depending on the state of the output multiplexer select switch 20, i.e., functioning in a manner analogous to a SFD in a first (integration period) state and in a manner analogous to a CTIA in a second (readout) state.

The CTIA w/ML beneficially reduces the time-averaged power and the light emission by turning off the CTIA amplifier current except when the output multiplexer select switch 20 s closed (e.g., generally less than 1% of the time.) Furthermore, since the load 18 is removed from all but one of the unit cell amplifier transistors 12, and one common load is shared by many unit cells, the complexity of the CTIA w/ML unit cell is similar to that of a self-integrator (SFD), a less complex circuit. This simplification reduces the circuit area required to lay out the amplifier and improves the yield in large arrays.

Compared to a conventional SFD amplifier, the CTIA w/ML has higher gain and better linearity. By having higher gain, the output voltage of the CTIA w/ML has more immunity to external noise sources than a SFD. The CTIA w/ML can be utilized on focal planes with moderate to low radiometric fluxes. Since it responds quickly to changes in photon flux, the disclosed circuit is an excellent candidate for use in short wavelength scanning applications. The low noise, high gain, and design simplicity also make the circuit an ideal choice for use in large astronomy focal plane applications.

In summary, the CTIA w/ML performs as a CTIA amplifier when the external common load 18 is selected through the output multiplexer switch 20, and performs in a manner analogous to a SFD when the external common load 18 is not selected. A conventional CTIA and the CTIA w/ML in accordance with this invention have a similar high signal gain and excellent linearity. However, the conventional CTIA has higher power dissipation, higher light emission (a source of false signal), and requires more components and more circuit area for each unit cell than the CTIA w/ML. The SFD and CTIA w/ML have a similar low power dissipation, low light emission, and design simplicity in the unit cell amplifier. However, the SFD has a more non-linear output and lower signal gain, making it more susceptible to external noise. The CTIA w/ML thus provides the best features of each type of circuit (CTIA and SFD), while avoiding the disadvantages and drawbacks of each type of circuit.

While the detector 16 and unit cell 10 have been shown and described as being fabricated on separate chips or wafers and subsequently joined together, the teachings of this invention would apply as well if the detector and readout circuitry were fabricated together on the same substrate.

Furthermore, the teachings of this invention can be practiced using other materials for the radiation detector, such as a Group IVA material including Silicon or Germanium.

Thus, while the invention has been particularly shown and described with respect to preferred embodiments thereof, it will be understood by those skilled in the art that changes in form and details may be made therein without departing from the scope and spirit of the invention.

What is claimed is:

1. A unit cell having an input and an output, comprising:
   a driver transistor having an input node coupled to said input of said unit cell, an output node, and a node coupled to a first operating potential, said driver transistor being operational when said node is coupled to said first operating potential and when said output node is coupled to a second operational potential;
   a capacitance coupled between said input node and said output node;
   a reset switch coupled between said input node and said output node in parallel with said capacitance; and
   an output switch coupled between said driver transistor output node and said output of said unit cell, wherein said output switch, when closed, couples said driver transistor output node to said second operating potential through a load that is external to said unit cell such that said driver transistor is made operational.

2. A unit cell as in claim 1, wherein said input of said unit cell is coupled to an output of a radiation detector.

3. A unit cell as in claim 1, wherein said output node of said driver transistor is switchably coupled to an output line by said output switch, and also to said load which is coupled to said output line.

4. A unit cell as in claim 1, wherein said unit cell is one unit cell of a plurality of unit cells organized in a row and column matrix, wherein said output node of said driver transistor is switchably coupled to a column output line by said output switch, and also to said load which is coupled to said column output line.

5. A unit cell as in claim 1, wherein said load is comprised of an active load.

6. A unit cell as in claim 1, wherein said load is comprised of a passive load.

7. A unit cell as in claim 1, wherein said load is comprised of a constant current source.

8. A unit cell having an input and an output, comprising:
   a driver transistor having an input node coupled to said input of said unit cell, an output node, and a node coupled to a first operating potential;
   a capacitance coupled between said input node and said output node;
   a reset switch coupled between said input node and said output node in parallel with said capacitance; and
   an output switch coupled between said driver transistor output node and said output of said unit cell, wherein said output switch, when closed, couples said driver transistor output node to a second operating potential through a load that is external to said unit cell;
   wherein said load is switchably coupled to said second operating potential through a load switch.

9. A unit cell having an input and an output, comprising:
   a driver transistor having an input node coupled to said input of said unit cell, an output node, and a node coupled to a first operating potential;
   a capacitance coupled between said input node and said output node;

a reset switch coupled between said input node and said output node in parallel with said capacitance; and an output switch coupled between said driver transistor output node and said output of said unit cell, wherein said output switch, when closed, couples said driver transistor output node to a second operating potential through a load that is external to said unit cell;

wherein said load is switchably coupled to said output of said unit cell through a load switch.

10. A readout circuit comprised of an x-row by y-column array of readout unit cells each having an input for coupling to an output of a radiation detector and an output that is switchably coupled to one of y column output lines, each said unit cell comprising a driver transistor having a gate terminal coupled to said input of said unit cell, a source terminal coupled to a source voltage, and a drain terminal coupled to a drain voltage through one of y current sources, said drain terminal being switchably coupled to said one of y current sources through an output multiplexer switch, said one of y current sources being a common current source for all of the x unit cells coupled to a same one of said y column output lines, said unit cell further comprising a capacitance coupled between said gate terminal and said drain terminal and a reset switch coupled between said gate terminal and said drain terminal.

11. A readout circuit as in claim 10, wherein each of said y current sources is switchably coupled to said drain voltage through an associated one of y load switches.

12. A readout circuit as in claim 10, wherein each of said y current sources is switchably coupled to an associated one of said y column output lines through an associated one of y load switches.

13. A method for operating a unit cell that is coupled to a radiation detector, comprising steps of:

closing a select switch within the unit cell for coupling a driver transistor to a load that is located external to the unit cell, the driver transistor and load operating as an inverting amplifier in a CTIA mode of operation;

resetting the unit cell by closing a reset switch that is coupled in parallel with a CTIA feedback capacitance, thereby enabling an output voltage of the unit cell to assume a reset value;

opening the reset switch for enabling the unit cell output voltage to change by an amount given by $I_{detector}T/C_{FB}$, where $I_{detector}$ is a current from the radiation detector, T is a time since opening the reset switch, and $C_{FB}$ is a value of the feedback capacitance;

sampling the value of output voltage; and opening the select switch, thereby decoupling the driver transistor from the external load.

14. A method as in claim 13, and further comprising a step of closing the select switch within a second unit cell for coupling the driver transistor of the second unit cell to the same load that is also located external to the second unit cell.

15. A method as in claim 13, wherein when the select switch is opened, operating the unit cell in a self-integrator, source-follower-per-detector (SFD) mode.

16. A method for operating an array of radiation detectors, comprising steps of:

providing a set comprised of a plurality of units cells, individual ones of the plurality of unit cells having an input coupled to an associated individual one of a plurality of radiation detectors;

during a first time period, operating a first subset of the plurality of unit cells in an integration mode in a Source Follower per Detector (SFD) configuration while operating a second subset of the plurality of unit cells in a readout mode in a Capacitive Transimpedance Amplifier (CTIA) configuration; and during a second time period, operating at least some of the first subset of the plurality of units cells in the readout mode in the CTIA configuration while operating the second subset of the plurality of unit cells in the SFD configuration.

\* \* \* \* \*